United States Patent [19]
Fuke et al.

[11] Patent Number: 5,834,794
[45] Date of Patent: Nov. 10, 1998

[54] SUPERCONDUCTING DEVICE

[75] Inventors: Hiroyuki Fuke, Kawasaki; Kazuo Saitoh; Youichi Enomoto, both of Tokyo, all of Japan

[73] Assignees: Kabushiki Kaisha Toshiba, Kawasaki; International Superconductivity Technology Center, Tokyo, both of Japan

[21] Appl. No.: 848,268

[22] Filed: Apr. 29, 1997

[30] Foreign Application Priority Data

Apr. 30, 1996 [JP] Japan .................................. 8-109664

[51] Int. Cl.$^6$ .................................................. H01L 29/06
[52] U.S. Cl. ..................... 257/39; 257/31; 326/5
[58] Field of Search ................................ 257/30–33, 36, 257/39; 365/162; 326/4, 5; 327/186

[56] References Cited

U.S. PATENT DOCUMENTS

| | | | |
|---|---|---|---|
| 4,330,841 | 5/1982 | Yamada et al. | 364/784 |
| 5,218,297 | 6/1993 | Nakane et al. | 324/248 |
| 5,365,476 | 11/1994 | Mukhanov | 365/162 |
| 5,443,567 | 8/1995 | Jillie et al. | 357/5 |

OTHER PUBLICATIONS

Forrester, et al. "A Single Flux Quantum Shift Register Operating at 65k", IEEE Transactions on Applied Superconductivity, vol. 5, No. 2 Jun.(1995), pp. 3401–3404.

Primary Examiner—Sara W. Crane
Attorney, Agent, or Firm—Oblon, Spivak, McClelland, Maier & Neustadt, P.C.

[57] ABSTRACT

Disclosed is a superconducting device comprising a logic SQUID and a readout SQUID magnetically coupled with the logic SQUID, which are fabricated using a single layer of an oxide high-temperature superconductor, wherein the logic SQUID comprising a superconducting loop constituted by a first superconducting line, a second superconducting line arranged to be parallel to the first superconducting line, third and fourth superconducting lines provided to connect the first and second superconducting lines, and two Josephson junctions formed in the third and fourth superconducting lines, and widths $W_1$ and $W_2$ of the first and second superconducting lines are larger than a distance d between them, the width $W_2$ is larger than the width $W_1$, and the widths $W_1$ and $W_2$ are larger than the widths $W_3$ and $W_4$ of the third and fourth superconducting lines.

11 Claims, 4 Drawing Sheets

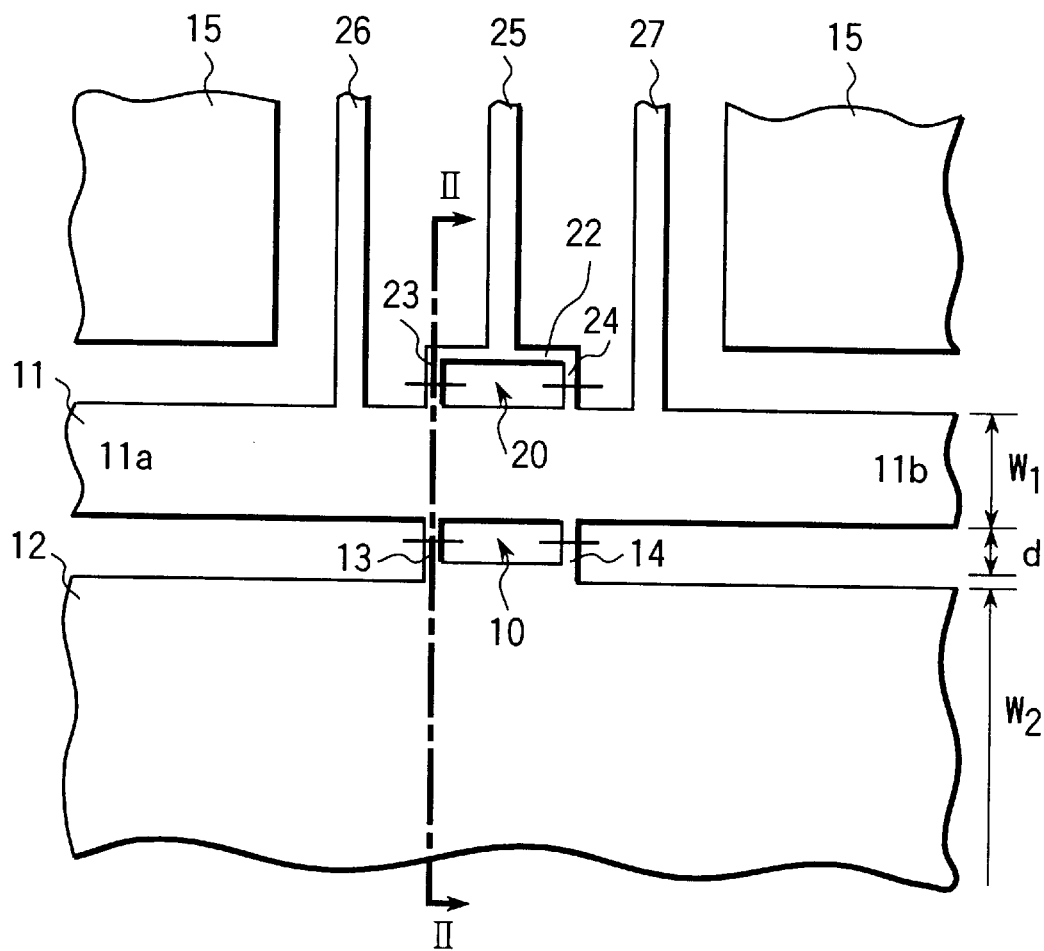
F I G. 1
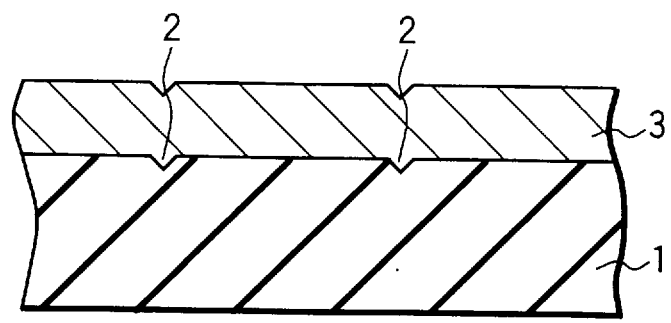
F I G. 2

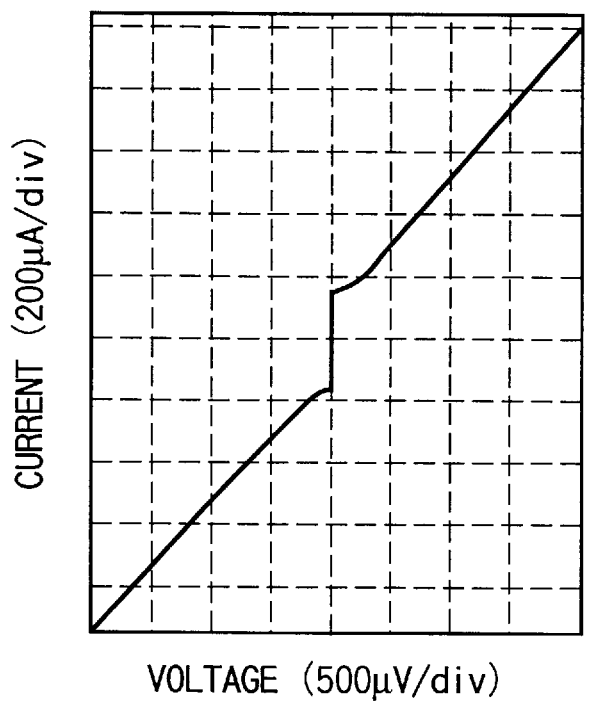
F I G. 4 A
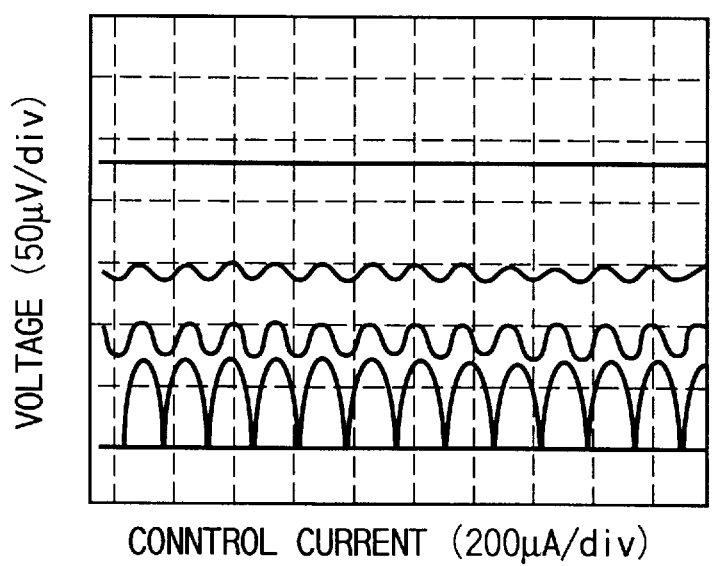
F I G. 4 B

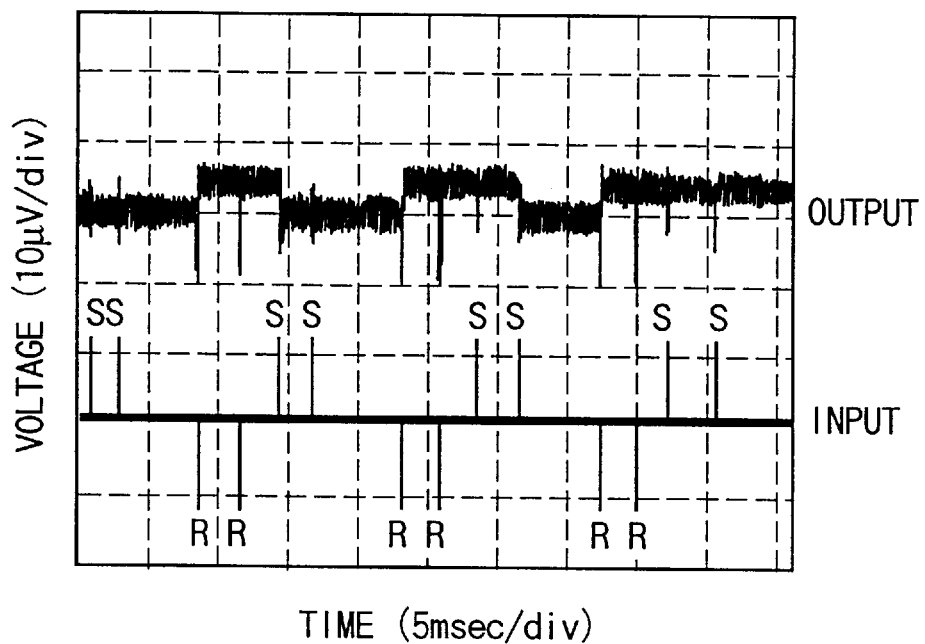
F I G. 5
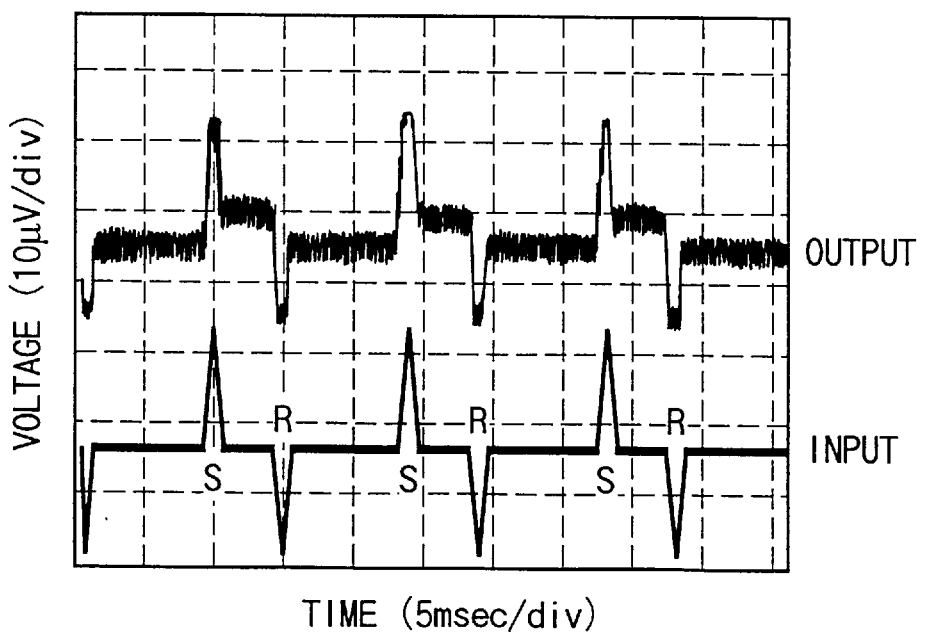
F I G. 6

SUPERCONDUCTING DEVICE

BACKGROUND OF THE INVENTION

This invention relates to a superconducting device, in particular, to a superconducting device using a single flux quantum as an information medium, which is capable of high-speed operation with low power consumption and functions as a basic element of a superconducting logic circuit.

Conventionally, various superconducting devices constituting a superconducting logic circuit have been proposed. In particular, a superconducting device using a single flux quantum as an information unit can operate at a high-speed with low power consumption, and thus is expected to show performance remarkably exceeding that of the semiconductor logic circuit most used in the present time. When the single flux quantum is used as an information unit of a logic circuit, a superconducting loop including at least one Josephson junction (superconducting quantum interference device, hereinafter referred to as "SQUID") is often used as a superconducting device in view of the controllability of the single flux quantum. The presence and absence of the single flux quantum in the superconducting loop constituting the SQUID correspond to the logical values, "1" and "0".

The following devices are known as the superconducting logic circuit device:

In the IEEE TRANSACTIONS ON APPLIED SUPERCONDUCTIVITY vol. 1 (1991), No. 1, pages 3–28, it is described that superconducting loop including two Josephson junctions (hereinafter referred to as "dc-SQUID") is fabricated by using metal superconductor, and that the dc-SQUID functions as a basic element to define the logical values. It is also reported in IEEE TRANSACTIONS ON APPLIED SUPERCONDUCTIVITY vol. 5 (1995), No. 2, pages 3401–3404, that dc-SQUID using an oxide high-temperature superconductor is fabricated, and that the dc-SQUID functions as a basic element to define the logical values.

In these conventional techniques, the following conditions are required to obtain stable operation of the device:

(1) The critical currents of the two Josephson junctions, which constitutes the dc-SQUID functioning as a basic element to define the logical values, are substantially the same; and (2) The optimum range of the inductive parameter $\beta_L$, which represents the relationship of the external and internal magnetic fields of the dc-SQUID to define the logical values, is 3–10, and thus the loop inductance of the dc-SQUID is required to be set to as low value as 10–30 pH.

In the superconducting logic circuit using the metal superconductor as disclosed in the former prior art, the technique to equalize the critical currents of the two Josephson junctions are established and it is also relatively easy to reduce the loop inductance by stacking the superconducting layers. However, the critical temperature of the metal superconductor is very low, and thus the device can only work at an extremely low temperature as 4.2K.

On the other side, in the superconducting logic circuit using the oxide high-temperature superconductor as disclosed in the latter prior art, the critical temperature of the oxide high-temperature superconductor is high in comparing with the metal superconductor, and thus there is less restriction in operating temperature of the device. When the oxide high-temperature superconductor is used in the superconducting logic circuit, however, the above-mentioned conditions (1) and (2) cannot be easily satisfied. That is, the technique of forming two Josephson junctions using the oxide high-temperature superconductor so as to equalize the device characteristics such as critical currents has not been established yet, and it is thus difficult to fabricate the superconducting logic device with good reproducibility and to obtain stable operation thereof. In addition, impedance matching between external input device and the superconducting device does not be attained, and thus a high-speed operation cannot be easily obtained. Further, the satisfactory stacking technique of the oxide superconductor layers has not been developed, so that the superconducting device is inevitably fabricated using a single oxide superconducting layer. Therefore, it has been demanded to easily reduce the loop inductance of the superconducting device consisting of the single oxide superconducting layer.

BRIEF SUMMARY OF THE INVENTION

An object of the present invention is to provide a superconducting device consisting of a single superconducting layer which has satisfactorily low loop inductance, can define securely the logical values on the basis of presence and absence of the single flux quantum in the superconducting loop, and constitutes a basic element of the superconducting logic circuit capable of high-speed operation with low-power consumption. An other object of the present invention is to provide a superconducting device which can operate without any fault even if the device characteristics (critical current values or normal conductive resistance values) of two Josephson junctions included in a logic SQUID. A further object of the present invention is to provide a superconducting device which can operate at a temperature exceeding 4.2K by using oxide superconductor.

The superconducting device according to the present invention comprises a logic SQUID and a readout SQUID magnetically coupled with the logic SQUID, which are formed on the same plain, wherein the logic SQUID comprising a superconducting loop constituted by a first superconducting line, a second superconducting line arranged to be parallel to the first superconducting line, third and fourth superconducting lines provided to connect the first and second superconducting lines, and at least one Josephson junction formed in the third and fourth superconducting lines; and the readout SQUID comprising a superconducting loop constituted by at least a part of the first superconducting line, a fifth superconducting line arranged to be parallel to the first superconducting line, sixth and seventh superconducting lines provided to connect the first and fifth superconducting lines, and at least two Josephson junctions formed at positions except the first superconducting line; and wherein each of widths $W_1$ and $W_2$ of the first and second superconducting lines are larger than a distance d between the first and second superconducting lines, the width $W_2$ of the second superconducting line is larger than the width $W_1$ of the first superconducting line, and the widths $W_1$ and $W_2$ of the first and second superconducting lines are larger than the widths $W_3$ and $W_4$ of the third and fourth superconducting lines.

It is preferable that the width $W_2$ of the second superconducting line is as large as possible, and is at least more than five times of the width $W_1$ of the first superconducting line.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plain view of a superconducting device according to the embodiment of the present invention;

FIG. 2 is a sectional view of the superconducting device according to the embodiment of the present invention;

FIGS. 4A and 4B are graphs showing the current-voltage characteristics and the response characteristics to the magnetic field of the readout dc-SQUID constituting the superconducting device according to the present invention;

FIG. 5 is a graph showing the input and output characteristics of the superconducting device (Sample 1) in the embodiment of the present invention; and FIG. 6 is a graph showing the input and output characteristics of the superconducting device (Sample 2) in the embodiment of the present invention.

DETAILED DESCRIPTION OF THE INVENTION

Figure 3A:
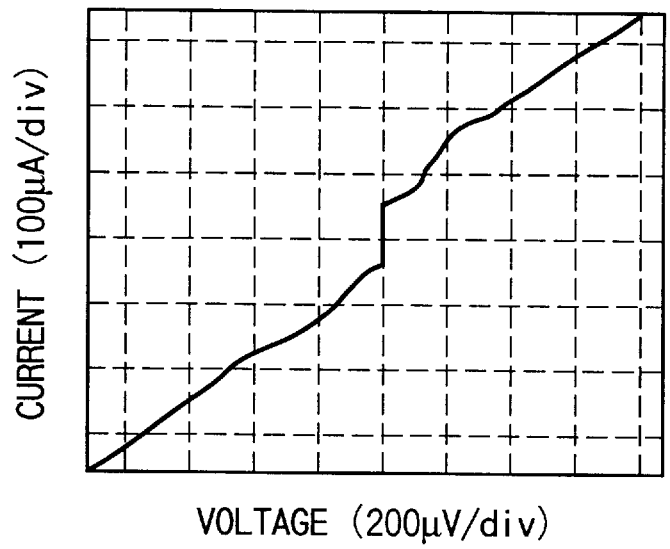
FIGS. 3A and 3B are graphs showing the current-voltage characteristics and the response characteristics to the magnetic field of the logic dc-SQUID constituting the superconducting device according to the present invention.

The superconducting device of the present invention is fabricated using a single superconducting layer formed on the same plain, and the Josephson junctions are formed at positions where grain boundaries are introduced in the superconducting layer. In the superconducting device of the present invention, two Josephson junctions are usually included in the superconducting loops constituting the logic SQUID and readout SQUID, respectively. The two Josephson junctions included in the superconducting loops constituting the logic SQUID may differ from each other in the device characteristics, in case, may be greatly different in the device characteristics as if it were only one Josephson junction is included in the loop.

In the superconducting device of the present invention, it is preferable to connect superconducting wires to the both ends of the first and second superconducting lines and to connect at least one superconducting wire to the fifth superconducting line to input and output signals through the wires.

In the superconducting device of the present invention, it is further preferable to form a superconducting line having the same potential as that of the second superconducting line in a region excluding the region of the readout SQUID where is symmetrical to the superconducting wires connected to the both ends of the second superconducting line with respect to the superconducting wires connected to the both ends of the first superconducting line.

The superconducting device may be formed by using various superconductors such as an oxide superconductor. For example, the oxide superconductor represented by a general formula $RBa_2Cu_3O_y$ may be used, where R is at least one element selected from the group consisting of Y, Nd, Sm, Eu, Gd, Dy, Ho, Er, Tm and Yb, and $6 < y \leq 7$.

The superconducting device of the present invention is operated by inputting a pulse voltage having a polarity (positive, for example) to inject the flux quantum to the logic SQUID, and by inputting a pulse voltage having a reverse polarity (in this case, negative) to release the flux quantum from the logic SQUID. In this case, the superconducting device capable of defining the logical values at a high stability on the basis of the presence and absence of the single flux quantum in the superconducting loop can be realized, even if the device characteristics such as critical current and normal conductive resistance of the two Josephson junctions in the logic SQUID differ from each other.

In a general superconducting loop, the loop inductance decreases as the inner size decreases and the outer size increases. The impedance matching between the external input means and superconducting device is controlled by properly setting the widths $W_1$ and $W_2$ of the first and second superconducting lines and the distance d between them.

Accordingly, by setting the widths $W_1$ and $W_2$ of the first and second superconducting lines to be larger than the widths $W_3$ and $W_4$ of the third and fourth superconducting lines, the decrease of the loop inductance can be realized while controlling the characteristics of the Josephson junctions so as to satisfy the operational conditions of the superconducting device. And thus, the stable operation of the superconducting device can be obtained even if the device is fabricated using only a single superconducting layer. Similarly, by properly setting the widths $W_1$ and $W_2$ of the first and second superconducting lines and the distance d between them, the impedance matching between the external input means and the superconducting device can be realized and, therefore, high-speed operation can be attained. As a result, it is able to provide a superconducting device formed of the oxide superconductor that uses a single flux quantum as an information medium and functions as a basic element of a superconducting logic circuit capable of high-speed operation with low power consumption at a temperature exceeding 4.2K.

EXAMPLES

The example of the present invention will be described below.

The superconducting device shown in FIGS. 1 and 2 was formed in the following manner. FIG. 1 is a plain view of a superconducting device of the present invention, and FIG. 2 is a sectional view of the superconducting device taken along a line II—II.

Firstly, damage was linearly applied to four points on a MgO substrate 1 with use of focusing ion beam (FIB) to form grooves 2. In this process, the substrate was irradiated with $Ga^+$ ion under conditions of an accelerating voltage of 30 kV, a beam diameter of 50 nm, a current density of $2.5 \times 10^{17}$ $cm^{-2}$, and an irradiation time of 320 seconds. As a result, the grooves 2 each having a size of 20 mm×0.2 mm were formed.

On the entire surface of the MgO substrate 1, a superconducting thin film 3 made of $NdBa_2Cu_3O_y$ having a thickness of 100 nm was deposited. The deposition was performed by off-axis RF magnetron sputtering on the substrate set at 840° C. under the total pressure of 70 mTorr in the atmosphere of $Ar/O_2=4/1$. The critical temperature of the superconducting thin film 3 was 80K.

Grain boundaries were formed at the positions of the superconducting thin film 3 on the grooves 2 on the substrate 1 with superconducting weak coupling, and consequently Josephson junctions were formed.

Next, photoresist (OMR 83) was coated on the superconducting thin film 3 deposited in the above-mentioned manner, and then patterning was performed by $Ar^+$ dry etching, and the device shown in FIG. 1 was fabricated. This device has a coplanar structure in order to decrease the inductance and to attain impedance matching between the external input device and the superconducting device for high-speed operation.

The structure of the superconducting device will be more specifically described below in conjunction with FIG. 1.

A logic dc-SQUID 10 is structured as follows: A first superconducting line 11 having a width $W_1$ of 50 $\mu$m is formed as the central conductive member of the coplanar structure. A second superconducting line 12 to be used as a ground line is formed in parallel to the first superconducting line 11 such that a part of the second superconducting line 12 is protruded toward the first superconducting line 11. The second superconducting line 12 has a width more than 2 mm. The distance between the first and second superconducting lines 11 and 12 is set to be 10 $\mu$m at the protruding portion and 20 $\mu$m at the other portion. The sides of the protruding portion of the second superconducting line 12 are connected to the first superconducting line 11 by third and fourth superconducting lines 13 and 14 each having a width of 5 $\mu$m. The third and fourth superconducting lines 13 and 14 are arranged on the grooves 2 formed on the MgO substrate 1 so as to form Josephson junctions. The logic dc-SQUID 10 is constituted by the superconducting loop comprising the first to fourth superconducting lines and the two Josephson junctions. The superconducting loop has an inner size of 50 $\mu$m long and 10 $\mu$m wide. The extending portions from the both ends of the first and second superconducting lines 11 and 12 included in the superconducting loop constituting the logic dc-SQUID 10 are used as superconducting wires for signal input and output.

A readout dc-SQUID 20 is constituted as follows: A fifth superconducting line 22 is formed in parallel to the first superconducting line 11 constituting the logic dc-SQUID 10. The both ends of the fifth superconducting line 22 and the first superconducting line 11 are connected to each other by sixth and seventh superconducting lines 23 and 24 each having a width of 5 $\mu$m. The sixth and seventh superconducting lines 23 and 24 are arranged on the grooves 2 formed on the MgO substrate 1 so as to form Josephson junctions. The readout dc-SQUID 20 is constituted by the superconducting loop comprising the fifth to seventh superconducting lines and the two Josephson junctions. As is clear from the above description, the readout dc-SQUID 20 is arranged to share a part of the superconducting loop with the logic dc-SQUID. A superconducting wire 25 is connected to the fifth superconducting line 22, and two superconducting wires 26 and 27 are connected to the first superconducting line 11 such that the fifth superconducting line 22 is arranged between the superconducting wires 26 and 27. These superconducting wires 25, 26 and 27 are used to conduct a control current or bias current to the logic dc-SQUID 10 and the readout dc-SQUID 20. Note that two Josephson junctions may be formed in any of fifth, sixth and seventh superconducting lines 22, 23 and 24, if they are formed on the both sides with respect to the connection point of the superconducting loop with the superconducting wire 25.

A superconducting line 15, which is used as a ground line and has the same potential as the second superconducting line 12, is formed in a region except the region of readout dc-SQUID 20 so as to be arranged symmetrically to wires on the both ends of the second superconducting line 12 with respect to the wires on the both ends of the first superconducting line 11. The superconducting wires are provided with an electrodes (not shown) for measuring the device characteristics on their ends, which are formed by depositing gold of 100 nm thick.

Several superconducting devices were formed in accordance with the above-mentioned processes under the same conditions. The Josephson junctions formed of the oxide superconductor may have various characteristics, even if they were fabricated under the same conditions.

The superconducting devices formed in the above-mentioned manner were cooled to liquid helium temperature and device characteristics were measured as follows.

The following is the result of the measurement of Sample 1.

Figure 3B:
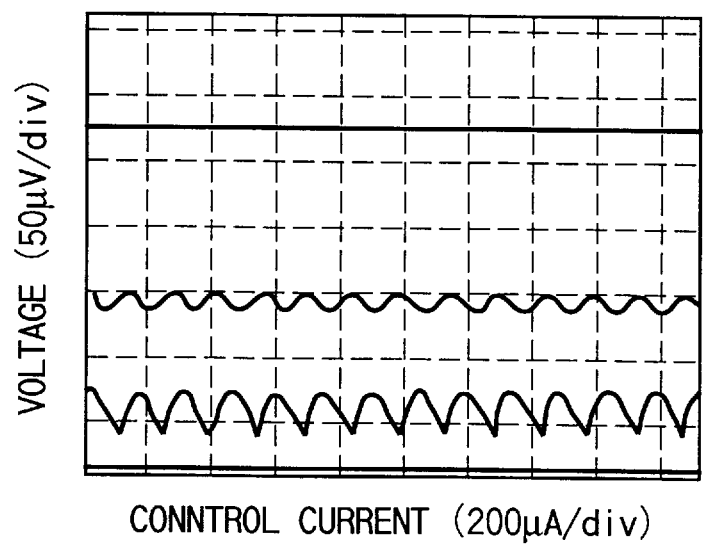

FIG. 3A shows current-voltage characteristics and FIG. 3B shows the magnetic field response characteristics of the logic dc-SQUID 10. FIG. 4A shows current-voltage characteristics and FIG. 4B shows the magnetic field response characteristics of the readout dc-SQUID 20.

In comparing with FIGS. 3A and 4A, the current-voltage characteristics of the logic dc-SQUID 10 have kinks, which shows that the critical current values of the two Josephson junctions of the logic dc-SQUID 10 differ from each other. Similarly, in comparing with FIGS. 3B and 4B, the waveform of the magnetic field response characteristics of the logic dc-SQUID 10 is distorted, which also shows that the critical current values of the two Josephson junctions of the logic dc-SQUID 10 differ from each other. As a result of the detailed analysis, the critical current values of the two Josephson junctions of the logic dc-SQUID 10 differ from each other by about 50%. The inductive parameter $\beta_L = 2\pi L I_C / \phi_0$ of the logic dc-SQUID 10 is determined to be 20.

The controllability of the logical values "0" and "1" as the basic logical operation of the superconducting device was tested. More specifically, the second superconducting line 12 was grounded and a triangle pulse wave having a width of 0.14 msec and a height of 3 mV was input from superconducting wires 11a and 11b on the both ends of the first superconducting line 11, and the output voltage of the readout dc-SQUID 20 was measured. In this measurement, the change in the presence and absence of the single flux quantum in the superconducting loop of the logic dc-SQUID 10 can be detected from the voltage level of the readout dc-SQUID 20.

FIG. 5 shows input and output characteristics of the Sample 1. The waveform of the lower graph in FIG. 5 shows the timing and the polarity of the input pulse. In FIG. 5, positive pulses were input from the superconducting wire 11a at points S, and negative pulses were input from the superconducting wire 11b at points R. As is apparent from FIG. 5, the output voltage of the readout dc-SQUID 20 was switched when a negative pulse was input following to a positive pulse or a positive pulse was input following to a negative pulse, and the readout dc-SQUID 20 maintained the voltage even after the pulse passed. On the other hand, no change occurred in the output voltage of the readout dc-SQUID 20 when a negative pulse following to the negative pulse or a positive pulse following to the positive pulse was input. This phenomenon shows that the single flux quantum is injected into the logic dc-SQUID 10 with input of the positive pulse, and the single flux quantum is maintained in the logic dc-SQUID 10 and is released from the logic dc-SQUID 10 with input of the negative pulse. In this manner, two logical values are defined at a high stability.

The same operation as above was obtained when positive and negative pulses were input using only one of the superconducting wires 11a and 11b while the second superconducting line 12 was grounded.

The measurement result of Sample 2 will be described next. It was found from the result of measurement of the current-voltage characteristics and the magnetic field response characteristics of the logic dc-SQUID 10 of the Sample 2 that the critical current values of the two Josephson junctions in the logic dc-SQUID 10 are substantially the same.

FIG. 6 shows the input and output characteristics of the Sample 2. In the graph, positive pulses and negative pulses were input at points S and points R, respectively, only using the superconducting wire 11a. The same result as in FIG. 5 was obtained in FIG. 6. That is, the readout dc-SQUID 20 was switched with a change of the polarity of the input pulses, and the two logical values were defined at a high stability.

The same operation as above was obtained when positive and negative pulses were input only using the superconducting wire 11b while the second superconducting line 12 was grounded.

In the measurement of the Sample 1, the critical current values of the two Josephson junctions of the logic dc-SQUID differ from each other by about 50%. The same operation was obtained also in other samples when the above-mentioned difference was at least 10%. For an extreme example, the device wherein the critical current value of one of the two Josephson junctions was sufficiently large and only one Josephson junction seemed to be contained in the device, the same result as that of the Sample 1 was obtained.

In the measurement of the Sample 2, there was no substantial difference in the critical current values of the two Josephson junctions of the logic dc-SQUID. The same operation was obtained also in other samples when the above-mentioned difference was less than 10%. Note that, when the difference in the critical current values of the two Josephson junctions of the logic dc-SQUID are substantially the same, the superconducting device can be operated even by inputting pulses having same polarity from both superconducting wires 11a and 11b, as is the case of the general superconducting loop.

As described above, the device according to the present invention can define the two logical values at a high stability, irrelevant of the differences in the device characteristics such as the critical current values of the two Josephson junctions of the logic dc-SQUID.

Although the above-cited measurements were performed under 4.2K, it goes without saying that the device of the present invention can be operated within the temperature range below the critical temperature of the oxide superconductor to be employed.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A superconducting device comprising a logic SQUID and a readout SQUID magnetically coupled with the logic SQUID, which are formed on the same plain, wherein the logic SQUID comprising a superconducting loop constituted by a first superconducting line, a second superconducting line arranged to be parallel to the first superconducting line, third and fourth superconducting lines provided to connect the first and second superconducting lines, and at least one Josephson junction formed in the third and fourth superconducting lines; and the readout SQUID comprising a superconducting loop constituted by at least a part of the first superconducting line, a fifth superconducting line arranged to be parallel to the first superconducting line, sixth and seventh superconducting lines provided to connect the first and fifth superconducting lines, and at least two Josephson junctions formed at positions except the first superconducting line; and wherein each of widths $W_1$ and $W_2$ of the first and second superconducting lines are larger than a distance d between the first and second superconducting lines, the width $W_2$ of the second superconducting line is larger than the width $W_1$ of the first superconducting line, and the widths $W_1$ and $W_2$ of the first and second superconducting lines are larger than the widths $W_3$ and $W_4$ of the third and fourth superconducting lines.

2. The superconducting device according to claim 1, wherein the Josephson junctions are formed at grain boundaries introduced in the superconducting lines.

3. The superconducting device according to claim 2, wherein the grain boundaries are introduced in a superconducting thin film deposited on grooves formed on a substrate.

4. The superconducting device according to claim 1, wherein each of the superconducting loops respectively constituting the logic SQUID and readout SQUID includes two Josephson junctions.

5. The superconducting device according to claim 4, wherein the two Josephson junctions included in the superconducting loop constituting the logic SQUID differ from each other in device characteristics.

6. The superconducting device according to claim 5, wherein a difference between critical current values of the two Josephson junctions included in the superconducting loop constituting the logic SQUID is 10% or more.

7. The superconducting device according to claim 1, wherein superconducting wires for signal input and output are connected to both ends of each of the first and second superconducting lines in the superconducting loop constituting the logic SQUID, and at least one superconducting wire for signal input and output is connected to the fifth superconducting line in the superconducting loop constituting the readout SQUID.

8. The superconducting device according to claim 7, wherein a superconducting line having the same potential as that of the second superconducting line is formed in a region excluding the region of the readout SQUID where is symmetrical to the superconducting wires connected to the both ends of the second superconducting line with respect to the superconducting wires connected to the both ends of the first superconducting line.

9. A superconducting device comprising a logic SQUID and a readout SQUID magnetically coupled with the logic SQUID, which are fabricated using a single layer of an oxide high-temperature superconductor formed on a substrate, wherein the logic SQUID comprising a superconducting loop constituted by a first superconducting line, a second superconducting line arranged to be parallel to the first superconducting line, third and fourth superconducting lines provided to connect the first and second superconducting lines, and two Josephson junctions at two positions of grain boundaries formed in the third and fourth superconducting lines, and superconducting wires for signal input and output are connected to both ends of each of the first and second superconducting lines; and the readout SQUID comprising a superconducting loop constituted by at least a part of the first superconducting line, a fifth superconducting line arranged to be parallel to the first superconducting line, sixth and seventh superconducting lines provided to connect the first and fifth superconducting lines, and two Josephson junctions formed at two positions of grain boundaries formed in the fifth, sixth and seventh superconducting lines except the first superconducting line, and superconducting wire for signal input and output is connected to the fifth superconducting line; and further comprising a superconducting line formed in a region excluding the region of the readout SQUID which is symmetrical to the superconducting wires connected to the both ends of the second superconducting line with respect to the superconducting wires connected to the both ends of the first superconducting line, where the second superconducting line and the superconducting line formed so as to be symmetrical to the superconducting wires connected to the both ends of the second superconducting line are grounded; and wherein each of widths $W_1$ and $W_2$ of the first and second superconducting lines are larger than a distance d between the first and second superconducting lines, the width $W_2$ of the second superconducting line and the width of the superconducting line formed so as to be symmetrical to the superconducting wires connected to the both ends of the second superconducting line that are grounded are larger than five times of the width $W_1$ of the first superconducting line, and the widths $W_1$ and $W_2$ of the first and second superconducting lines are larger than the widths $W_3$ and $W_4$ of the third and fourth superconducting lines.

10. The superconducting device according to claim 9, wherein the two Josephson junctions included in the superconducting loop constituting the logic SQUID differ from each other in device characteristics.

11. The superconducting device according to claim 10, wherein a difference between critical current values of the two Josephson junctions included in the superconducting loop constituting the logic SQUID is 10% or more.

* * * * *